United States Patent [19]

Linde et al.

[11] Patent Number: 4,729,797

[45] Date of Patent: Mar. 8, 1988

[54] PROCESS FOR REMOVAL OF CURED EPOXY

[75] Inventors: Harold G. Linde; Elizabeth T. Murphy; Denis J. Poley, all of Richmond, Vt.

[73] Assignee: International Business Machines Corporation, Armonk, N.Y.

[21] Appl. No.: 948,259

[22] Filed: Dec. 31, 1986

[51] Int. Cl.$^4$ .................... C09D 9/00; C09D 9/04
[52] U.S. Cl. ........................................ 134/38; 134/2; 134/42; 156/659.1; 156/904; 252/171; 252/542; 252/549; 252/DIG. 8
[58] Field of Search ............... 134/2, 38, 42; 252/542, 252/171, 549, DIG. 8; 156/659.1, 904

[56] References Cited

U.S. PATENT DOCUMENTS

| | | | |
|---|---|---|---|
| 3,673,099 | 6/1972 | Corby et al. | 252/156 |
| 4,168,989 | 9/1979 | Edelman et al. | 134/28 |
| 4,171,240 | 10/1979 | Wong | 156/630 |
| 4,276,186 | 6/1981 | Bakos et al. | 252/158 |
| 4,294,729 | 10/1981 | Bakos et al. | 134/38 |
| 4,304,681 | 12/1981 | Martin et al. | 252/143 |
| 4,518,675 | 5/1985 | Kataoka | 430/256 |

OTHER PUBLICATIONS

Baczewski, Metallography, 3(4), pp. 481-482 (1970).
Linde et al, Novel Solvent System for the Removal of Hardened Photoresists, IBM Tech Disc Bull, vol. 26, No. 12, p. 6303.
Clark et al, Nondestructive Chemical Removal of Encapsulants Used in Semiconductor Packaging, IBM Tech Disc Bull., vol. 23, No. 12, p. 5282.
Coating Removal Process, IBM Tech. Disc. Bull., vol. 28, No. 2, p. 825.

*Primary Examiner*—Asok Pal
*Attorney, Agent, or Firm*—Theodore E. Galanthay; Barbara A. McDowell

[57] ABSTRACT

The cleaning compositions of the present invention comprise pyridine or substituted pyridines alone or in admixture with sulfoxides. Preferred compositions comprise pyridine and dimethylsulfoxide (DMSO). Any concentration of DMSO from 0-50% can be used, but preferred compositions contain 5-25% DMSO. The present invention is employed to treat integrated circuit modules enclosed in a cap or can. Following treatment the cap or can, which is sealed to the substrate by means of the cured epoxy, can be removed to allow rework. The preferred method of removing the cured epoxy from module substrates is by refluxing in the solution. The cured epoxy is totally removed and there is no attack of the Al-Cu or Sn-Pb metallurgies or chip polyimide passivation. The silicone overcoat material is not removed from behind the chips, eliminating the need to reapply the material after rework.

6 Claims, No Drawings

PROCESS FOR REMOVAL OF CURED EPOXY

BACKGROUND OF THE INVENTION

The present invention is a process for removing epoxy compositions from a substrate and especially for removing cured epoxy compositions employed as the backseal without removing silicone materials employed as the topseal for integrated circuit chip modules.

During the preparation of integrated circuit modules, input/output (I/O) pins are inserted into the substrate of the module. Attached to the backside of the substrate is at least one integrated circuit chip. The input/output pins provide the needed electrical connections to the integrated circuit chips on the backside of the substrate or carrier. A topseal of a silicone gel, such as Sylgard (trademark of Dow Corning Corporation), is used to protect the chips from alpha-particle emissions from the substrate material. After application of the Sylgard, the assembled module is placed in a vacuum to flow the Sylgard into the space between the chip and the substrate. Sylgard also remains on top of the chip, although this is not needed for protection from alpha particles. The chip carrier or substrate is placed inside a cap or container with the backside of the carrier being covered by the bottom of the cap or container. The backside of the carrier or substrate on which is attached at least one integrated circuit chip is hermetically sealed to the cap or container, such as by employing certain epoxy compositions. The compositions are employed in order to protect and seal the electrically active portions of the module.

In many situations it is desirable to be able to remove the cap in order to make engineering changes or to replace or repair the semiconductor devices on the carrier. This removal of the cap must be done without destroying the rest of the module so that it can be worked on and reused. It is often desirable to remove the cap without also removing the topseal material from behind the chip (between the chip and the substrate), thus eliminating the need to replace the topseal after rework.

The difficulty has been to provide a composition capable of removing the cured epoxy backseal without removing the silicone topseal from behind the chip and without adversely affecting the rest of the module. Since such a composition will be used in a manufacturing environment, it must be safe and non-toxic. Clark et al., "Nondestructive Chemical Removal of Encapsulants Used in Semiconductor Packaging," IBM Technical Disclosure Bulletin, vol. 23, no. 12, May 1981, p. 5285, discloses a solvent having about 95% by volume n-butylamine and about 5% by volume of oleic acid for removing organic epoxies, such as Scotchcast (trademark of 3M Company) 5239, from semiconductor chip packages. However, the mixture also removes silicone gels, such as Sylgard, from behind the chips. Moreover, it has been determined that this mixture cause low levels of corrosion of Al-Cu metallurgy. Finally, the mixture has a flash point of $-1°$ C., which is unacceptably low from a safety standpoint.

A mixture of pyridine and dimethyl sulfoxide (1:0 to 1:2) has been used to remove hardened photoresists. (Linde, et al. "Novel Solvent Soak for the Removal of Hardened Photoresists," IBM Technical Disclosure Bulletin, vol. 26, no. 12, May 1984, p. 6303.) However, there is no suggestion that mixtures of pyridine or substituted pyridines with sulfoxides are capable of removing cured epoxy and no suggestion that they will remove cured epoxy without attacking Sylgard.

SUMMARY OF THE INVENTION

It is therefore an object of the invention to improve the removal of cured epoxy.

It is a further object of the invention to provide a process for removing cured epoxy from an encapsulated integrated circuit module without removing silicone top seal from behind the chip.

It is another object of the invention to provide a process for removing cured epoxy from an encapsulated integrated circuit module without adversely affecting the rest of the module.

It is yet another object of the invention to provide a composition and process for removing cured epoxy that is safe and non-toxic.

These and other objects are achieved by employing compositions of pyridine or substituted pyridines with sulfoxides. In a preferred embodiment, pyridine is mixed with dimethyl sulfoxide (DMSO). Any concentration of DMSO from 0% to 50% by volume can be used. However, preferred compositions have from 5% to 25% DMSO. The epoxy sealed encapsulated module is refluxed for 15 to 30 minutes in the composition. The epoxy backseal is totally removed and the silicone overcoat topseal on top of the chips is stripped. The silicone overcoat topseal between the chip and the substrate is not stripped. The metallurgy is clean and uncorroded.

DESCRIPTION OF THE PREFERRED EMBODIMENTS

The substrates which are treated according to the present invention include those substrates commonly used in the preparation of integrated circuit modules or carriers, such as ceramic substrates. Typical ceramic substrates include aluminum oxides and glass ceramics.

The cured or thermoset epoxy compostions which are to be removed from the substrate can be any composition in which the epoxy is the primary bonding agent. Any cured epoxy polymer can be treated according to the present invention, an example of which is a cured epichlorohydrin bisphenol-A epoxy, such as Scotchcast (trademark of 3M Company) 5239. The epoxies are generally cured with well-known epoxide curing agents, such as acids and anhydrides. Of course, the epoxy compositions can contain other substituents such as plasticizers, flexibilizers, stabilizers, fillers, pigments and the like. However, since the epoxy is the predominant, and in many cases the sole, bonding agent in the compositions removed according to the present invention, the presence of other ingredients does not change the nature of the present invention.

The present invention is employed to treat integrated circuit modules enclosed in a cap or can. The substrate then includes preformed holes through which input-/output (I/O) pins are be inserted so as to protrude from one surface of the substrate for insertion into circuit cards or boards. The pins also protrude slightly from the other side referred to as the backside so as to contact the circuitry on the backside which, in turn, connects to the integrated circuit chip or chips mounted on the backside of the substrate. These chips may have cured polyimide passivation or surface protection layers. The chips can be mounted by well-known solder techniques. The pins of the module can be any of the input/output pins well-known in the art. Examples of suitable pins are gold plated pins, and tin-lead solder coated pins.

The cap or can into which the module is placed is preferably a metal, for example aluminum, and is used to protect the backside and especially the chips from mechanical damage. The walls of the cap are closely toleranced with the dimensions of the substrate to provide a close fit. Once the module is placed inside, the cap can be crimped and the epoxy composition applied which then adheres the substrate hermetically to the sides of the cap to seal the backside from the surrounding environment. The cap may also include stand-offs upon which the chip carrier can rest to prevent the chips from physically contacting the bottom of the inside of the cap.

Prior to inserting the module into the cap, the module can be coated with a topseal coating to protect the chips from alpha particle emissions from the substrate. The topseal coating is typically a cross-linked polysiloxane. A commonly employed topseal is the silicone gel, Sylgard (trademark of Dow Corning Corporation). This material acts as an effective environmental and alpha barrier, and helps to cool the chips. In order to rework the chip or substrate, it is necessary to remove this silicone overcoat material from the top of the chip.

As is apparent from the above discussion, the compositions of the present invention must not only be able to remove the epoxy compositions, but must not adversely affect the other materials which make up the encapsulated integrated circuit module, such as the input/output pins, the cap, and the chips which may have cured polyimide passivation.

The cleaning compositions of the present invention comprise pyridine alone or in admixture with dimethylsulfoxide (DMSO). Substituted pyridines, such as collidine, the picolines, the lutidines as well as other substituted pyridines, would also work in the present invention and would have the added advantage of raising the boiling point. Other sulfoxides according to Formula I which are liquid at room temperature could also be used.

(I)

wherein R and R' are each selected independently from straight and branched alkyl having from 1 to 3 carbon atoms, and phenyl (which may optionally be substituted with one or more hydroxyl), or R and R' together are alkane of 3 to 6 carbon atoms.

DMSO may constitute as much as 50% of the mixture by volume. Pure pyridine may also be used, but preferred compositions have from 5-25% DMSO. The flash point varies with the exact composition of the solution, but a 3:1 mixture of pyridine-DMSO has a flash point of approximately 31° C. The preferred method of removing cured epoxy from module substrates is by refluxing the substrates in the solution.

The following examples, while not limiting, are illustrative of the present invention. Except for Example 1, all of the examples were carried out using a borosilicate glass reaction flask with a refluxing condenser. The top and bottom sections of the flask were secured with a reaction flask clamp. The configuration allows the solution to boil under reflux, thus providing additional mechanical agitation which aids in the removal process and prevents solvent loss. The solution can be cooled to room temperature (or below) prior to removal of the stripped parts. The equipment used is available with flasks ranging in size from 50 to 5000 mls which allows scale up for production purposes. Example 1 was simply heated in the solution without refluxing.

The modules used in the following examples conformed with the description given above. The epoxy used to adhere the substrates to the caps was Scotchcast 5239. The Scotchcast was cured at 105° C. for 4-6 hours or at 150° C. for 4 hours. The silicone overcoat material used was Sylgard. Because the compositions according to the present invention are non-ionizing, there was no corrosion of the metallurgy and a simple rinse in deionized water was sufficient to remove the excess solvent from the surface. It has been found that the Sylgard remaining under the chips turns white after treatment. However, a post bake at 100° C. for 30 minutes drove off residual solvent and made the Sylgard clear again.

EXAMPLE 1

| pyridine | 83.5 vol % |
|---|---|
| DMSO | 16.5 vol % |

Modules were heated in the solution at 80° C. for 30 minutes.

EXAMPLE 2

| pyridine | 99 vol % |
|---|---|
| DMSO | 1 vol % |

Modules were refluxed in the solution at 110° C. for 15 minutes.

EXAMPLE 3

| pyridine | 75 vol % |
|---|---|
| DMSO | 25 vol % |

Modules were refluxed in the solution at 116° C. for 20 minutes.

EXAMPLE 4

| pyridine | 90 vol % |
|---|---|
| DMSO | 10 vol % |

Modules were refluxed in the solution for 15 minutes.

In all of the examples, the cured epoxy was totally removed and the Sylgard was removed from the top of the chips.

The effect of the pyridine-DMSO solutions on the metallurgy and chip polyimide passivation was assessed. Pieces of Al-Cu wire and Sn-Pb foil were placed in an individual bath of the heated solution of example 1 for 30 minutes at 80° C. Possible corrosion to the metallurgy was assessed by two methods. Gravimetric results showed that there was minimal attack on the Al-Cu and Pb-Sn. The % weight loss of the Al-Cu wire was 0.04% at 80° C./30 minutes and the % weight loss of the Sn-Pb was 0.002% at 80° C./30 minutes. Inductively coupled argon plasma (ICAP) spectrographic results of a typical bath over its respective blank after module strip showed 10.1 ppm Cu, 1.6 ppm Pb and 0.5 ppm Sn. Aluminum was not detected. The effect of the pyridine-DMSO solutions on the polyimide passivation was assessed by placing a cured film of duPont 5057 (trademark of E.I. duPont deNemours) in a hot pyridine-DMSO bath of Example 1. No attack of the polyimide occurred.

While the invention has been described with respect to specific embodiments, it will be understood by those skilled in the art that various changes in detail may be made therein without departing from the spirit, scope, and teaching of the invention. For example, inert solvents such as Freon, para-toluenesulfonic acid, oleic acid or NMP can be added. Surfactants may also be added. Accordingly, the invention herein disclosed is to be limited only as specified in the following claims.

We claim:

1. A method for removing cured epoxy from a substrate which comprises contacting the cured epoxy with a mixture comprising:
   (a) one or more compounds of formula (I)

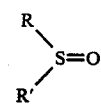

wherein R and R' are each selected independently from straight and branched alkyl having from 1 to 3 carbon atoms, and phenyl, which may optionally be substituted with one or more hydroxyl, or R and R' together are alkane of 3 to 6 carbon atoms; and
   (b) one or more compounds selected from the group consisting of pyridine and substituted pyridines.

2. A method according to claim 1 wherein said substituted pyridines are members of the group consisting of picoline, lutidine, and collidine.

3. The method according to claim 2 wherein the cured epoxy is an epichlorohydrin bisphenol-A epoxy.

4. The method according to claim 3 wherein the substrate is part of an integrated circuit module.

5. The method according to claim 4 wherein the compound according to Formula (I) is dimethyl sulfoxide.

6. The method according to claim 5 wherein the mixture is refluxed.

* * * * *